United States Patent [19]
Blair et al.

[11] Patent Number: 5,235,495
[45] Date of Patent: Aug. 10, 1993

[54] PEN-BASED COMPUTER WITH HANDLE/PROP HAVING RATCHET LOCKING MECHANISM

[75] Inventors: William A. Blair, Worcester, Mass.; Scott J. Dankman, Reston, Va.

[73] Assignee: Telepad Corporation, Reston, Va.

[21] Appl. No.: 947,431

[22] Filed: Sep. 21, 1992

[51] Int. Cl.[5] .................... H05K 5/02; G06F 1/16
[52] U.S. Cl. .................... 361/680; 361/683; 361/740; 220/756; 220/762; 16/126; 248/674; 74/523; 74/527; 74/528
[58] Field of Search ............... 220/756, 761, 762, 763, 220/764; 16/126, 321–326; 248/455, 674; 74/523, 527, 528, 536; 361/380, 390, 391–395, 427–429, 399; 364/708; 312/223.1, 223.2, 244; 235/1 D

[56] References Cited

U.S. PATENT DOCUMENTS

| | | | |
|---|---|---|---|
| 2,388,567 | 11/1945 | Patterson, Jr. ................ | 220/756 X |
| 3,878,964 | 4/1975 | Fogle ................ | 220/756 |
| 3,924,775 | 12/1975 | Andreaggi et al. ................ | 220/756 |
| 4,089,464 | 5/1978 | Teti, Jr. et al. ................ | 16/126 X |
| 4,196,821 | 4/1980 | Teti, Jr. et al. ................ | 16/126 X |
| 4,669,053 | 5/1987 | Krenz ................ | 364/708 |
| 4,951,241 | 8/1990 | Hosoi et al. ................ | 364/708 |
| 4,964,018 | 10/1990 | Mallory et al. ................ | 361/391 |
| 5,049,862 | 9/1991 | Dao et al. ................ | 340/706 |
| 5,100,098 | 3/1992 | Hawkins ................ | 248/917 |
| 5,168,601 | 12/1992 | Liu ................ | 16/126 |

Primary Examiner—Leo P. Picard
Assistant Examiner—Michael W. Phillips
Attorney, Agent, or Firm—Antonelli, Terry, Stout & Kraus

[57] ABSTRACT

An improved handle/prop is provided for a pen-based computer wherein the handle/prop is pivotally mounted to opposite side edges of the computer. The handle/prop can be pivoted and locked into a plurality of different positions. In particular, these positions are selected to facilitate carrying the computer, supporting the computer on a flat surface in one or more inclined positions for writing and/or viewing, and holding the computer during writing. A ratchet locking mechanism is provided for locking the handle/prop into the plurality of different positions. This ratchet locking mechanism includes first and second release buttons located at points where the handle/prop pivotally connects at opposite side edges of the computer. In addition, the ratchet locking mechanism includes a handle-tie piece extending through the interior of the computer to spring bias the release button into a locked position.

28 Claims, 3 Drawing Sheets

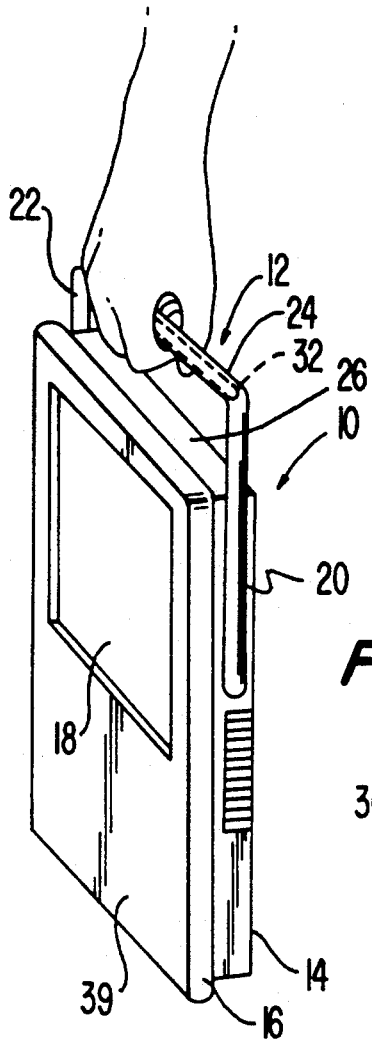
FIG.1
FIG.2
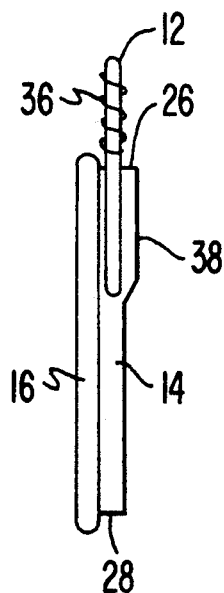
FIG.3
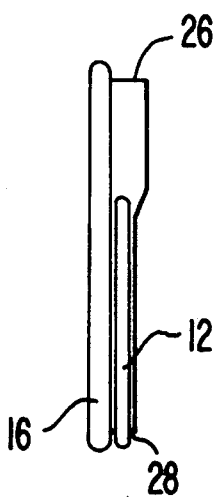
FIG.4
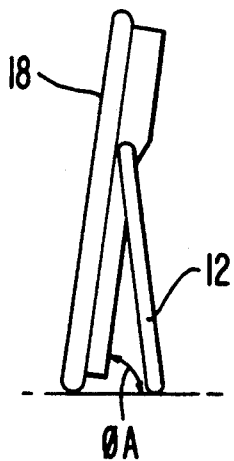
FIG.5
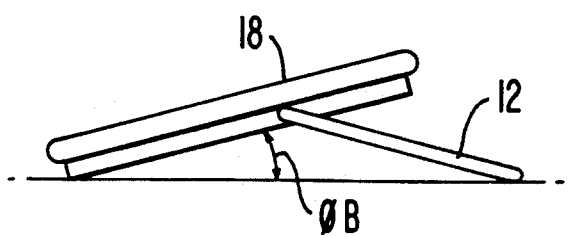
FIG.6

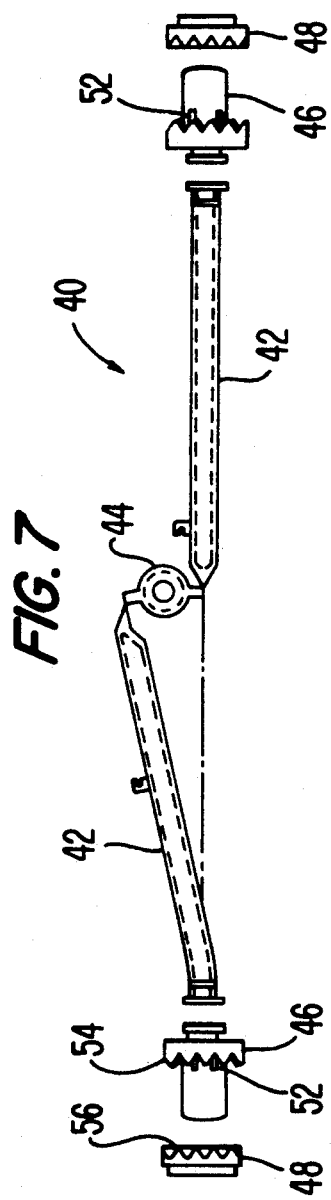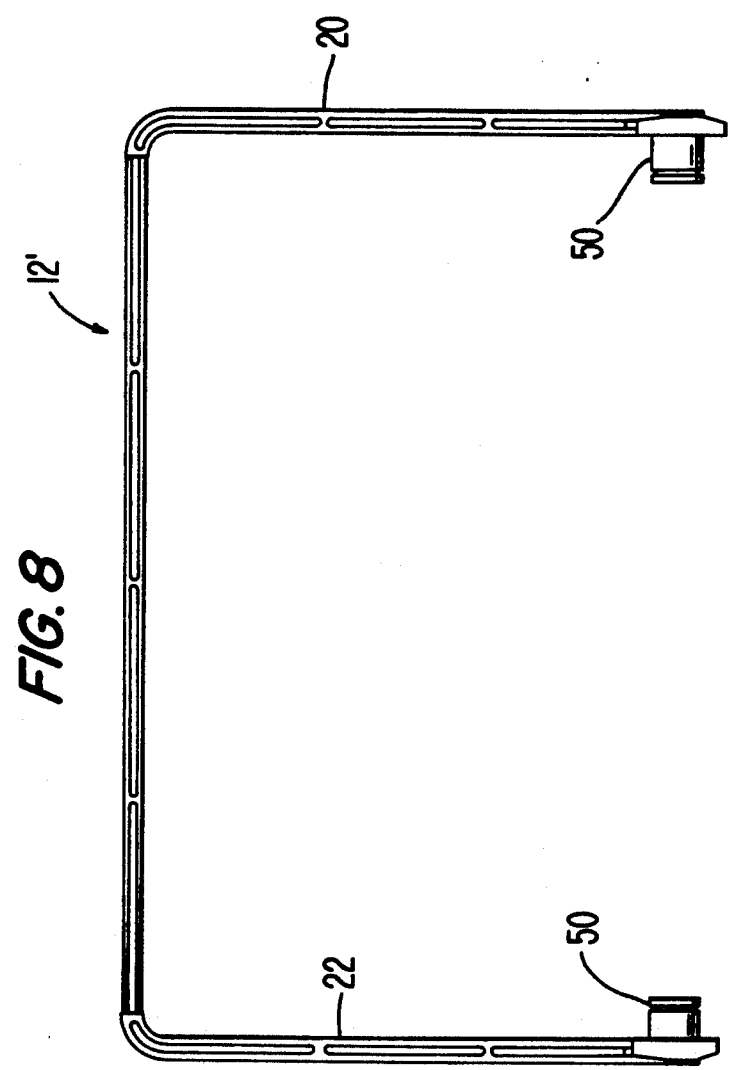

PEN-BASED COMPUTER WITH HANDLE/PROP HAVING RATCHET LOCKING MECHANISM

BACKGROUND OF THE INVENTION

This invention is generally related to pen-based computers, and more particularly to a highly versatile handle/prop arrangement for facilitating use of such a pen-based computer.

Recently, a new type of computer, commonly referred to as a pen-based computer (although also sometimes referred to as a note-pad computer, a hand-held computer or a palm-top computer) has been commercially introduced in various forms. Unlike their predecessors, the well-known lap-top computers, pen-based computers do not require a keyboard to either enter or retrieve information. Instead, such information is typically entered or retrieved through the use of a light pen operating directly on the computer's screen.

The elimination of the need for a keyboard has a number of definite advantages. Obviously, for people who do not know how to type, the pen-based computer is extremely attractive as a way of availing themselves of the benefits of a computer without having to learn to type. Also, the elimination of the keyboard permits even further reductions in size and weight relative to the extremely popular lap-top computers.

On the other hand, there has been some problems with previously developed pen-based computers in terms of positioning them for actual use. Obviously, they can be used in a flat position on a table, or picked up and held for use. However, these are not always the most comfortable or convenient positions for either writing in or viewing information. Also, the conventional lap-top "clam shell" configuration (having the screen on one side and the keyboard on the other) is not as appropriate for a pen-based computer because it does not have a keyboard. Accordingly, although pen-based computers are becoming more and more popular because of their obvious benefits, they do not have the same versatility for comfort and convenience of data entry and display which many people would like.

SUMMARY OF THE INVENTION

Accordingly, one object of the present invention is to provide a convenient handle/prop arrangement for a pen-based computer that will permit both carrying and supporting the pen-based computer in various positions.

Another object of the present invention is to provide a handle/prop arrangement which will permit carrying the computer, supporting the computer in at least two different positions on a table or other flat surface, and holding the computer with the handle/prop conveniently out of the way.

To achieve these and other objects, the present invention provides a pen-based computer having a handle/prop pivotally mounted to opposite side edges of the computer. The handle/prop can be pivoted and locked into a plurality of different positions. In particular, these positions are arranged to facilitate carrying the computer, supporting the computer for writing and viewing on a flat surface, and holding the computer during writing.

BRIEF DESCRIPTION OF THE DRAWINGS

The above and other features of the present invention can be appreciated from the attached drawings in which:

FIG. 1 is a perspective view of a preferred embodiment of the handle/prop of the present invention in position for carrying the pen-based computer;

FIG. 2 is a detailed close-up view of the pivot point of the handle/prop of the present invention showing one embodiment for locking the handle/prop in various positions;

FIG. 3 is a side view of the handle/prop of FIG. 1 with the handle/prop in a carrying position;

FIG. 4 is a side view showing the handle/prop in a position convenient for hand-holding of the pen-based computer with the handle/prop out of the user's way;

FIG. 5 is a side view showing the handle/prop in an intended position for easy viewing on a flat surface;

FIG. 6 is a side view showing the handle/prop in an inclined position for easy data entry on a flat surface;

FIG. 7 is an exploded view of a ratchet locking arrangement which can be used in accordance with the second embodiment of the present invention;

FIG. 8 shows a handle assembly for use with the ratchet locking arrangement of FIG. 7;

DETAILED DESCRIPTION

Figure 9:
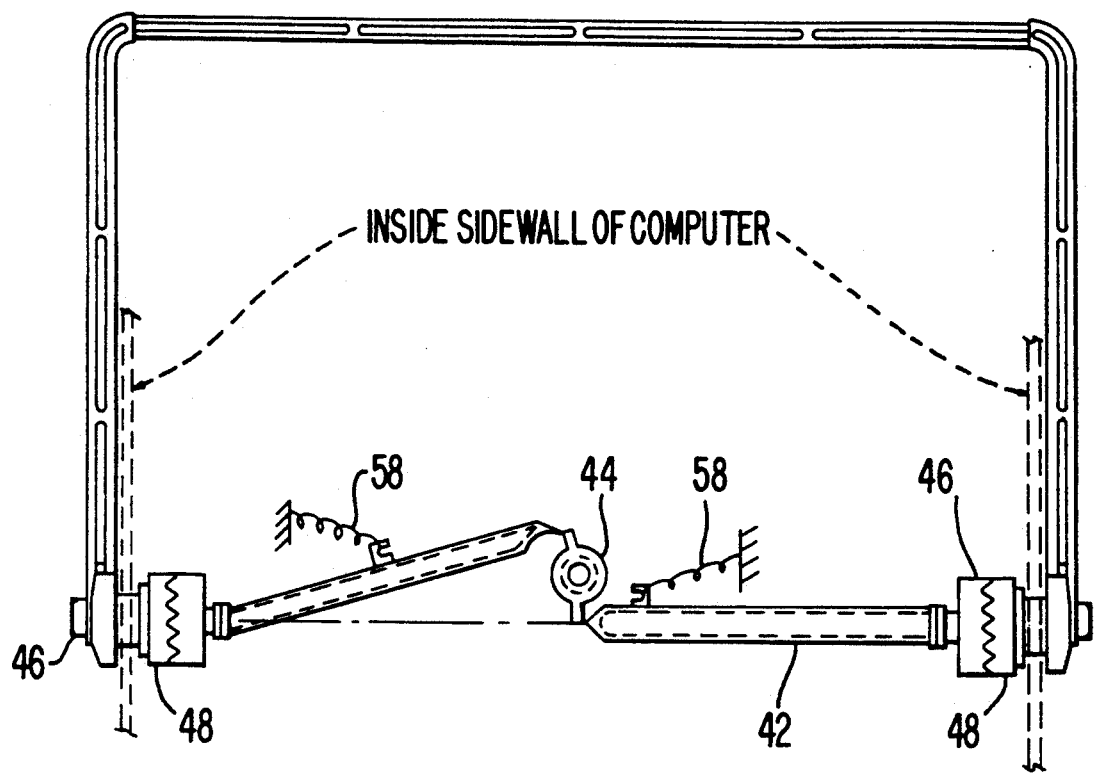
FIG. 9 is an assembled view showing the combination of the ratchet locking arrangement of FIG. 7 with the handle of FIG. 8, in a locked position.

Referring to FIG. 1, a preferred embodiment of the present invention is shown with a pen-based computer 10 being carried by the use of a handle/prop 12. The pen-based computer 10 is shown basically in simplified form as comprising a body 14, an overlapping front portion 16 and a screen 18. The actual internal elements of the pen-based computer 10 can be commercially available elements presently in use or known to be capable of use for such pen-based computers. For example, the internal system can be structured using an Intel 386 chip set, with a hard disk, a floppy disk, or recently introduced PCMCIA cards, as desired. The handle/prop 12 is attached to opposing sides of the body 14 of the computer 10 in a manner that facilitates the pivoting of the handle/prop to at least four positions, each of which has its own particular usefulness.

The handle/prop 12 preferably is formed to have first and second leg portions 20 and 22 and a crossbar portion 24. As can be appreciated from FIGS. 1, 3 and 4, the handle/prop 12 is preferably attached to the side 3 of the pen-based computer 10 in such a manner that the points of attachment are closer to the upper edge 26 of the computer than to the bottom edge 28. This has been done so that when the handle/prop 12 is swung toward the top of the computer, the crossbar 24 will be spaced away from the upper edge 26 of the computer. Incidentally, the pen-based computer 10 will typically be used in conjunction with a light pen, the illustration of which has been omitted for simplification of the drawings. This light pen can be conveniently attached to the upper edge 26 by a spring loaded clip, for example.

FIGS. 3–6 illustrate the four preferred positions for the handle/prop 12. Essentially, FIG. 3 shows a side view of the same first position shown in FIG. 1. In this first position, the handle/prop 12 has been swung to ensure that the crossbar 24 is at least far enough away from the upper edge 26 of the computer to permit the user's hand to be inserted between the crossbar and the upper edge.

In the second position shown in FIG. 4, on the other hand, the handle/prop 12 has been swung down so that the crossbar 24 is closely adjacent to the bottom edge 28 of the computer. In particular, as shown in FIG. 4, in the preferred embodiment, the handle/prop 12 is attached to the body 14 in such a manner that, in the second position, both of the leg portions 20 and 22 and the crossbar 24 will essentially b concealed beneath the overlapping front portion 16 when the computer is viewed from the front. This makes the computer very convenient to use in the hand-held mode by holding the top edge 26 with one's left hand while the bottom edge 28 rests in the crook of the left elbow (assuming right-handed use of the light pen). An alternate position which some users prefer is to have the handle/prop 12 extend out toward the back of the computer, substantially perpendicular to the body of the computer. The user can then grip the crossbar 24 with his left hand while further supporting the computer in the crook of his left arm.

FIG. 5 illustrates a third position of use wherein the handle/prop 12 can hold the computer 10 on a flat surface in a manner that is very convenient for viewing of the screen 18. This particular position can, for example, be useful in those instances where it is desired to use the pen-based computer 10 with a separate keyboard (not shown). Although pen-based computers do not need keyboard 3 to function it is sometimes useful to connect them to one to permit high-speed entry of data in a typed form. Also, this position is useful when the screen 18 of the computer is being utilized for purposes of displaying information to a group of people.

A fourth position of the pen-based computer 10 which is permitted by the handle/prop 12 is shown in FIG. 6. I this fourth position, the handle/prop 12 is pivoted and locked so that the computer can be slightly tilted up on a flat surface such as a table or desk top. This position is ideal to permit comfortable use of a light pen with the screen 18 when the computer is placed on a table, desk or other flat surface.

One arrangement for locking the handle/prop 12 firmly into a selected one of the four positions is shown in FIG. 2. This figure details the mounting of a first leg 20 to the body 14 of the computer at a pivot point 2B. A plurality of bumps 30 are provided at four locations on the side of the body 14 for engagement with a recess 32 provided on an inner side of the leg 20. Each bump 30 corresponds to one of the four positions discussed above for FIGS. 3-6.

In FIG. 2, the handle/prop 12 is shown locked in the first position which is shown in FIGS. 1 and 3. For the sake of clarity, the bump 30 that the recess 32 is actually engaged with in this first position is not shown. The single dot-dashed lines show how the handle/prop 12 would be engaged in each of the other three positions. It is noted, of course, that a similar locking arrangement could be provided, if desired, for the other leg 22 as well.

The locking embodiment shown in FIG. 2 is based on the fact that the legs 20 and 22 of the handle/prop 12 have some flexibility to permit sliding of the handle/prop from one position to the next by exerting sufficient force on the crossbar to slide the recess 32 out of engagement with one of the bumps 30 and into engagement with another one. The height of the bumps 30 and the depth of the recess 32 will depend upon the degree of the flexibility of the legs 20 and 22 to facilitate holding the handle/prop relatively firmly in a selected position while still being able to readily move it to another position when desired.

FIG. 1 also shows another aspect of the present invention for multiple use of the handle/prop 12. Specifically, if desired, an inner cavity 34 can be provided for the handle/prop 12 to house peripheral elements that are useful for pen-based computers. For example, one particular useful element for this inner cavity 34 would be an antenna to permit reception and/or transmission of information to and from the computer 10. Small circuit cards (e.g. a receiver or transmitter to operate in conjunction with the antenna) could also be provided in the cavity 34. Elements such as a bar code scanner or other circuitry could also be used in the cavity 34 if desired.

FIG. 3 shows a variation wherein an external antenna 36 is mounted by wrapping it around the handle/prop 12. In such a case, the external antenna 36 would preferably be laminated or bolted in some manner to keep it secure in its position on the handle and to prevent damage to it by the hands of the user. In this variation, the antenna 36 could be used in conjunction with elements mounted in the cavity 34 within the handle/prop 12, or directly in conjunction with the internal circuit elements of the pen-based computer 10. Also, although it is not shown in FIG. 3, it is to be understood that the external antenna 36 could extend along the crossbar portion 24 instead of, or in addition to, the location of the antenna along the leg portions 20 and 22.

In addition to the above-discussed features, FIGS. 2-5 show another variation of the body 14 that can be used, if desired, to implement a very slight tilt to the body when the pen-based computer is placed on a flat surface with the screen 18 facing upwards. Specifically, as can be seen in these figures, the back of the body 14 can include a protruding portion 38 near the upper portion of the body 14. When the pen-based computer 10 is laid on its back, the protruding portion 38 will, of course, provide a slight inclination to the front surface containing the screen 18. This can serve as a variation on the fourth position shown in FIG. 6 to provide the user with a selection of the degree of inclination that they would like for writing or viewing the screen. In another words, in addition to the four positions achieved by the use of the handle/prop in FIGS. 3-6, a fifth position could also be achieved by using the protruding portion 38. In this position, the handle/prop 12 could either be swung all the way up to the position shown in FIG. 3 or all the way down to the position shown in FIG. 4.

FIGS. 5 and 6 show angles of inclination $\phi_A$ and $\phi_B$ respectively, for the third and fourth positions. From studies made by the inventors, it has been found that a useful range $\phi_A$ is between 57° and 75°, while a useful range for $\phi_B$ is between 18° and 35°. In particular, it has been found that setting the third and fourth positions somewhere in these ranges provides for convenient viewing for the third position of FIG. 5 and convenient writing for the fourth position of FIG. 6. Of course, although these ranges are preferred, variations of this could be made without departing from the spirit and scope of the applicants' invention. Also, it is noted that the invention could be modified to have more than two inclined positions. For example, given the above-noted preferred ranges, one useful modification would be to provide four inclined positions of 18°, 35°, 57° and 75°. In other words, in accordance with this modified embodiment, there would actually be six positions for the handle/prop 12 to lock into, as opposed to the four positions noted in the basic embodiment of the invention discussed above. When combined with the additional inclination provided by the protruding portion 38 discussed above, this modified embodiment could actually provide seven different useful positions for the pen-based computer 10. Of course, as in the case of the ranges $\phi_A$ and $\phi_B$ noted above, the particular angles of inclination could be varied from the four angles discussed above without departing from the spirit and scope of the applicants' invention.

FIG. 1 also shows another important feature of the present invention which will now be discussed. Specifically as can be seen in FIG. 1, a palm rest area 39 is provided beneath the screen 18. In conjunction with this, the screen is preferably arranged is a landscape orientation such that the width of the screen is greater than the height of the screen. By providing the palm rest area 39 and using the landscape orientation for the screen 18, it is very convenient to write on any portion of the screen while having support for the lower part of the palm of the writing hand. The palm rest area 39 is particularly useful when one is using the pen to write on or access the lower edge of the screen 18 since, otherwise, the user's hand would extend over the bottom edge of the computer, which could become very uncomfortable after a period of time.

Although the invention is not limited to any particular dimensions, an example of a convenient device is one having an overall width and height of about $10\frac{1}{8}$ inches, a screen 18 with about a $7\frac{1}{2}$ inch width and a $5\frac{3}{4}$ inch height, and a palm rest area 39 with about a $4\frac{1}{2}$ inch height. These dimensions permit easy carrying of the device, in conjunction with convenient writing with the light pen both when the computer is held in the crook of one's arm or used in the desk-top position shown in FIG. 6.

In the above description, a preferred embodiment of the present invention and a modification thereof have been described which utilize a particular handle/prop structure to facilitate a number of possible positions which are especially useful for pen-based computers. It is to be noted, however, that variations of these embodiments are possible without departing from the spirit and scope of the applicants' invention.

For example, although a particular locking means using bumps 30 and a recess 32 has been illustrated, it is to be understood that other locking arrangements could be used. For example, a ratchet arrangement could be used, as will be discussed hereinafter. Also, if the bump/recess arrangement of FIG. 2 is used, it is noted that, technically, the top and bottom bumps 30 are not essential, although they are, of course, useful. In other words, in the position of FIGS. 1 and 3, it is not essential that the handle be locked into place since gravity will tend to hold the handle in the correct position anyway. Similarly, in the position of FIG. 4, the handle will tend to stay in the position illustrated when a person is holding the computer, especially if there is some friction between the bottom of the computer 28 and the crossbar 24.

FIGS. 7-10 provide one example of an extremely useful ratcheting arrangement that can be used to provide secure locking in a wide variety of positions, together with quick release buttons which can be operated from either side of the computer.

FIG. 7 provides an exploded view of the actual ratcheting assembly 40. This ratcheting assembly 40 will extend through the inside of the computer from the point where the leg 20 of the handle/prop 12' contacts the side of the computer to a point where the leg 22 contacts the other side of the computer. This ratcheting assembly 40 comprises a pair of handle ties 42, a deformable "living" hinge 44, a handle button 46 and a cup 48.

As shown in FIG. 8, each leg 20 and 22 of the handle/prop 12' will include a hollow receiving sleeve 50 which the cup 48 will slide over, and through which the button 46 will extend to protrude to the outside of the computer. The button 46 can include spacing ridges 52 which will engage the inside of the sleeve 50 to provide a predetermined even spacing between the shaft of the button and the inside of the sleeve.

The inside of the cup 48 preferable includes ridges which will engage groove in the outer surface of the sleeve 50 to provide a locked arrangement between the cup 48 and the sleeve 50 so that in order for the handle/prop 12' to rotate, the cup will have to rotate also. Alternatively, the inside of the cup 48 could have grooves which would be engaged by ridges in the outer surface of the sleeve 50 for this same purpose. In either case, when the cup 48 is locked in a position to hinder rotation, the handle/prop 12' will also be locked in position by virtue of the ridge/groove interrelationship between the inside of the cup and the outside of the sleeve.

Figure 10:
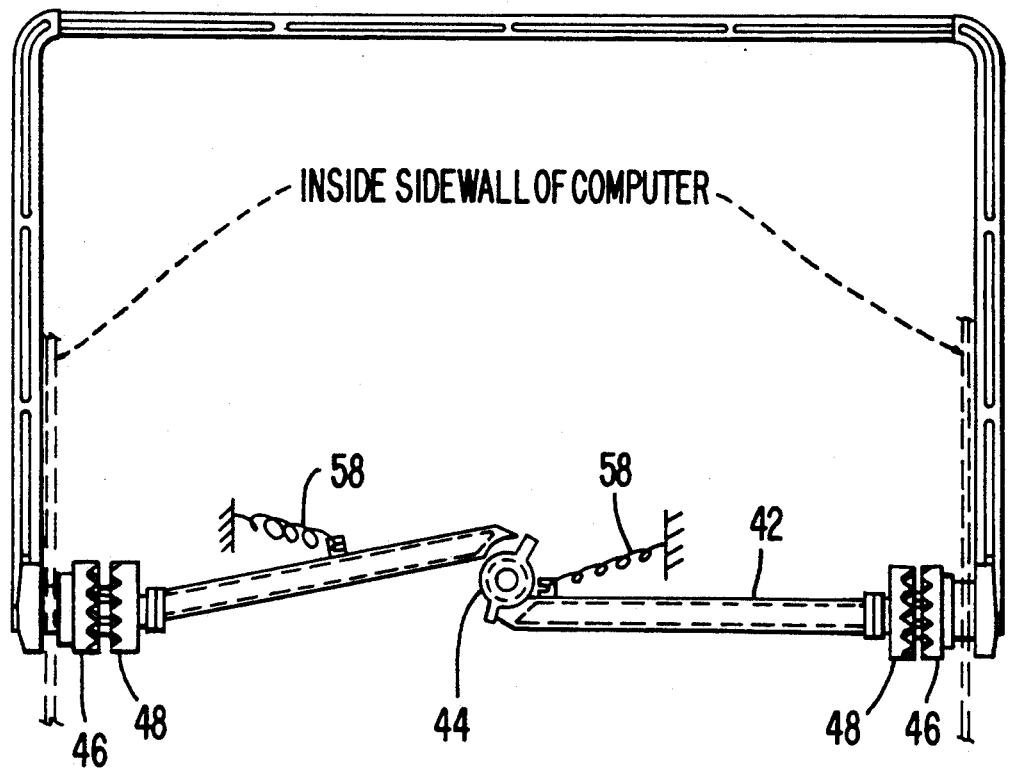
FIG. 10 is an assembled view similar to FIG. 9, except for showing the ratchet locking assembly in an unlocked position.

The handle button 46 and the cup 48 each have teeth 54 and 56, respectively, to engage each other for locking the handle/prop 12' into various positions. The teeth 54 of the handle button 46 are spring biased by the handle ties 42 into locking engagement with the teeth of the cup 48 by virtue of springs 58 attached to the handle ties 42, as shown in FIG. 9. This spring bias also presses the cups 48 firmly against the inside surfaces of the side walls of the computer case. Pressing either of the handle buttons 46 inwardly will release the spring tension of the teeth 54 of the buttons 46 against the teeth of the cups 48, as shown in FIG. 10, permitting the handle/prop 12' to rotate into a new position. The mutual release of both ratcheting arrangements on opposite sides of the computer is achieved by the pivoting operation of the handle ties 42 around the pivot point of the deformable hinge 44.

As noted above, the spring bias of the cup 48 against the inner sidewall of the computer (via the engagement with the teeth of the button 46) serves to lock both the cup and the handle/prop 12' in a desired position. It should be noted that, if desired, the degree of this spring bias can be set so that application of a reasonable amount of force on the crossbar 24 of the handle/prop 12' could cause the cup 48 to rotate slightly against the inner sidewall of the computer. This would permit making fine adjustments, as desired, in the actual handle/prop position relative to the body of the computer, thereby slightly changing the angle of orientation of the computer body.

Although not particularly limited thereto, the handle button 46 and the cup 48 are preferably formed of a glass filled polycarbonate material which provides a very hard, strong and durable device. The handle ties 42 and the deformable hinge 44 are preferably made of a superelastic plastic such as polypropylene or polyethylene. Such materials will permit the hinge 44 to flex many thousands of times without breaking to engage and disengage the locking teeth of the cups 48 from those of the buttons 46. Of course, other materials than those mentioned here could be used, if desired.

The teeth 54 on the button 46 and the teeth 56 on the cup 48 will, of course, determine the number of positions available for the ratcheting assembly. In accordance with a preferred embodiment of the present invention, twelve teeth can be provided to permit locking the handle/prop in any one of twelve positions, each 30° apart. Of course, the number of teeth could be varied, and the spacing of the teeth could be arranged to provide closer spacing for more useful positions and wide spacing in positions which are not likely to be used.

A major advantage of the ratcheting arrangement shown in FIGS. 7-10 is that it permits a very convenient release of the locking mechanism by pressing the buttons from either side while, at the same time, providing a secure locking when the buttons 46 are not pressed.

Of course, numerous other arrangements may be readily devised by those skilled in the art which embody the principles of the invention and fall within its spirit and scope.

We claim:

1. A pen-based computer having a handle/prop pivotally mounted to opposite side edges of the computer, wherein the handle/prop can be pivoted and locked into a plurality of different positions to respectively facilitate carrying the computer, supporting the computer on a flat surface in one or more inclined positions for writing and viewing, and holding the computer during writing, further comprising a ratchet locking mechanism for locking said handle/prop into said plurality of different positions;

wherein said ratchet locking mechanism includes first and second release buttons located at points where the handle/prop pivotally connects at opposite side edges of the computer; and wherein said ratchet locking mechanism includes a handle-tie piece extending through the interior of the computer so as to spring bias the release buttons into a locked position.

2. A pen-based computer according to claim 1, wherein the handle/prop includes an antenna.

3. A pen-based computer according to claim 2, wherein the antenna is embedded in the handle/prop.

4. A pen-based computer according to claim 2, wherein the antenna is wrapped around the handle/prop.

5. A pen-based computer according to claim 1, wherein the handle-tie piece includes a first leg portion contacting said first release button, a second leg portion contacting said second release button, a deformable hinge member joining the first leg portion to the second portion, and spring bias means for urging the first and second leg portions outwardly so as to spring bias the release buttons into the locked position.

6. A pen-based computer having a handle/prop, a front display surface with a screen, a top edge adjacent to the top of the front display surface, a bottom edge adjacent to the bottom of the front display surface, and first and second side edges adjacent to opposite side edges of the front display surface, wherein the improvement comprises said handle/prop having first and second portions pivotally connected to said first and second side edges of the pen-based computer and a crossbar portion connected to said first and second portions, and means for selectively locating said handle/prop in one of:

1) a first position for carrying the pen-based computer, wherein the crossbar portion is adjacent to, and spaced apart from, said top edge of the front display surface;

2) a second position wherein the crossbar portion is located adjacent to the bottom edge of the pen-based computer to permit hand-holding of the computer in a position for writing on the screen of the computer, wherein the distance between the crossbar portion and the bottom edge of the computer in the second position is less than the distance between the crossbar portion and the top edge of the computer in the first position;

3) a third position wherein the crossbar portion is located for supporting the pen-based computer in a first inclined position when the computer is placed on a flat surface to permit easy viewing of the screen of the pen-based computer; and 4) a fourth position wherein the crossbar portion is located for supporting the pen-based computer in a second inclined position less steep than the first inclined position when the computer is placed on a flat surface for permitting writing on the screen of the pen-based computer, further comprising a ratchet locking mechanism for locking said handle/prop into said plurality of different positions;

wherein said ratchet locking mechanism includes first and second release buttons located at points where the handle/prop pivotally connects at opposite side edges of the computer; and wherein said ratchet locking mechanism includes a handle-tie piece extending through the interior of the computer so as to spring bias the release buttons into a locked position.

7. A handle/prop according to claim 6, wherein said first and second portions of the handle/prop are mounted at said first and second side edges of said computer at locations closer to the top edge of the computer than to the bottom edge of the computer.

8. A handle/prop according to claim 7, wherein the first and second portions of the handle/prop are substantially parallel to one another, and wherein the crossbar portion is substantially perpendicular to said first and second portions.

9. A handle/prop according to claim 8, wherein the crossbar portion contacts the bottom edge of the computer in the second position.

10. A handle/prop according to claim 6, wherein said pen-based computer includes a back surface opposite to said front display surface, and wherein the total area of the front display surface is greater than the total area of the back surface so that said front display surface overlaps said back surface at least at the bottom edge and the first and second side edges of the computer so that said bottom edge and the first and second side edges of the computer include a recessed portion adjacent to the back surface of the computer.

11. A handle/prop according to claim 10, wherein said first and second portions of the handle/prop are connected to the computer in the recessed portions of the first and second side edges of the computer.

12. A handle/prop according to claim 11, wherein the handle is connected to the computer so that, in the second position, the first and second portions of the handle will be in the recessed portion of the first and second side edges, under the overlapping portion of the front display surface, and wherein the crossbar portion of the handle/prop will b in the recessed portion of the bottom edge of the computer, under the overlapping portion of the front display surface.

13. A handle/prop according to claim 12, wherein in the second position the handle/prop will not be visible when the computer is viewed from the front display screen.

14. A handle/prop according to claim 6, wherein the first and second portions of the handle/prop are substantially parallel to one another, and wherein the crossbar portion is substantially perpendicular to said first and second portions.

15. A handle/prop according to claim 6, wherein the crossbar portion contacts the bottom edge of the computer in the second position.

16. A handle/prop according to claim 6, wherein the handle/prop includes an antenna.

17. A handle/prop according to claim 6, wherein the third position inclines the computer at an angle between 57° and 75° relative to the flat surface, and wherein the fourth position inclines the computer at an angle between 18° and 35° relative to the flat surface.

18. A pen-based computer according to claim 6, wherein the handle-tie piece includes a first leg portion contacting said first release button, a second leg potion contacting said second release button, a deformable hinge member joining the first leg portion to the second portion, and spring bias means for urging the first and second leg portions outwardly so as to spring bias the release buttons into the locked position.

19. A pen-based computer having a handle/prop wherein the improvement comprises the handle/prop being pivotally attached to opposite sides of the computer to pivot and lock into a selected one of at least:
1) a first position for carrying the computer:
2) a second position to permit hand-holding of the computer in a position for writing on the screen of the computer;
3) a third position to support the computer in a first inclined position when the computer is placed on a flat surface to facilitate viewing the screen of the computer; and
4) a fourth position to support the computer in a second inclined position less steep than that of the first inclined position when the computer is placed on a flat surface to facilitate writing on the screen of the computer,
further comprising a ratchet locking mechanism for locking said handle/prop into said plurality of different positions
wherein said ratchet locking mechanism includes first and second release buttons located at points where the handle/prop pivotally connects at opposite side edges of the computer; and
wherein said ratchet locking mechanism includes a handle-tie piece extending through the interior of the computer so as to spring bias the release buttons into a locked position.

20. A handle/prop for a pen-based computer according to claim 19, wherein the handle/prop includes an antenna.

21. A handle/prop for a pen-based computer according to claim 20, wherein the antenna is embedded in the handle/prop.

22. A handle/prop for a pen-based computer according to claim 20, wherein the antenna is wrapped around the handle/prop.

23. A handle/prop according to claim 19, wherein the third position inclines the computer at an angle between 57° and 75° relative to the flat surface, and wherein the fourth position inclines the computer at an angle between 18° and 35° relative to the flat surface.

24. A pen-based computer according to claim 19, wherein the handle-tie piece includes a first leg portion contacting said first release button, a second leg portion contacting said second release button, a deformable hinge member joining the first leg portion to the second portion, and spring bias means for urging the first and second leg portions outwardly so as to spring bias the release buttons into the locked position.

25. A pen-based computer having a handle/prop, a front display surface with a screen, a top edge adjacent to the top of the front display surface, a bottom edge adjacent to the bottom of the front display surface, and first and second side edges adjacent to opposite side edges of the front display surface, wherein the improvement comprises said handle/prop having first and second portions pivotally connected to said first and second side edges of the pen-based computer and a crossbar portion connected to said first and second portions, and means for selectively locating aid handle/prop in one of:
1) a first position for carrying the pen-based computer, wherein the crossbar portion is adjacent to, and spaced apart from, said top edge of the front display surface;
2) a second position wherein the crossbar portion is located adjacent to the bottom edge of the pen-based computer to permit hand-holding of the computer in a position for writing on the screen of the computer, wherein the distance between the crossbar portion and the bottom edge of the computer in the second position is less than the distance between the crossbar portion and the top edge of the computer in the first position;
3) a third position wherein the crossbar portion is located for supporting the pen-based computer in a first inclined position when the computer is placed on a flat surface to permit easy viewing of the screen of the pen-based computer; and
4) a fourth position wherein the crossbar portion is located for supporting the pen-based computer in a second inclined position less steep than the first inclined position when the computer is placed on a flat surface for permitting writing on the screen of the pen-based computer, wherein said first and second portions of the handle/prop are mounted at said first and second side edges of said computer at locations closer to the top edge of the computer than to the bottom edge of the computer,
wherein the first and second portions of the handle/prop are substantially parallel to one another, and wherein the crossbar portion is substantially perpendicular to said first and second portions,
wherein the crossbar portion contacts the bottom edge of the computer in the second position,
wherein said pen-based computer includes a back surface opposite to said front display surface, and wherein the total area of the front display surface is greater than the total area of the back surface so that said front display surface overlaps said back surface at lest at the bottom edge and the first and second side edges of the computer so that said bottom edge and the first and second side edges of the computer include a recessed portion adjacent to the back surface of the computer, wherein said first and second portions of the handle/prop are connected to the computer in the recessed portions of the first and second side edges of the computer, and wherein the handle is connected to the computer so that, in the second position, the first and second portions of the handle will be in the recessed portion of the first and second side edges, under the overlapping portion of the front display surface, and wherein the crossbar portion of the handle/prop will be in the recessed portion of the bottom edge of the computer, under the overlapping portion of the front display surface, further comprising a ratchet locking mechanism for locking said handle/prop into said plurality of different positions;

wherein said ratchet locking mechanism includes first and second release buttons located at points where the handle/prop pivotally connects at opposite side edges of the computer; and wherein said ratchet locking mechanism includes a handle-tie piece extending through the interior of the computer so as to spring bias the release buttons into a locked position.

26. A handle/prop according to claim 25, wherein in the second position the handle/prop will not be visible when the computer is viewed from the front display screen.

27. A handle/prop according to claim 25, wherein the third position inclines the computer at an angle between 57° and 75° relative to the flat surface, and wherein the fourth position inclines the computer at an angle between 18° and 35° relative to the flat surface.

28. A pen-based computer according to claim 25, wherein the handle-tie piece includes a first leg portion contacting said first release button, a second leg portion contacting said second release button, a deformable hinge member joining the first leg portion to the second portion, and spring bias means for urging the first and second leg portions outwardly so as to spring bias the release buttons into the locked position.

* * * * *